(12) United States Patent
Shinsho

(10) Patent No.: US 9,786,763 B2
(45) Date of Patent: Oct. 10, 2017

(54) SEMICONDUCTOR DEVICE AND MANUFACTURING METHOD THEREOF

(71) Applicant: ROHM CO., LTD., Kyoto (JP)

(72) Inventor: Kohei Shinsho, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/347,157

(22) Filed: Nov. 9, 2016

(65) Prior Publication Data
US 2017/0133482 A1 May 11, 2017

(30) Foreign Application Priority Data

Nov. 11, 2015 (JP) ................................ 2015-221440

(51) Int. Cl.
| | | |
|---|---|---|
| H01L 21/322 | (2006.01) | |
| H01L 29/66 | (2006.01) | |
| H01L 21/324 | (2006.01) | |
| H01L 29/10 | (2006.01) | |
| H01L 29/34 | (2006.01) | |
| H01L 29/36 | (2006.01) | |
| H01L 29/739 | (2006.01) | |
| H01L 29/732 | (2006.01) | |

(52) U.S. Cl.
CPC ...... *H01L 29/66333* (2013.01); *H01L 21/324* (2013.01); *H01L 29/1095* (2013.01); *H01L 29/34* (2013.01); *H01L 29/36* (2013.01); *H01L 29/7395* (2013.01)

(58) Field of Classification Search
CPC .............. H01L 21/3223; H01L 21/324; H01L 29/66333–29/66348; H01L 29/7395–29/7398
See application file for complete search history.

(56) References Cited

U.S. PATENT DOCUMENTS

2017/0040420 A1* 2/2017 Mori ..................... H01L 29/739

FOREIGN PATENT DOCUMENTS

JP          H09-121052 A          5/1997

* cited by examiner

*Primary Examiner* — Daniel Shook
(74) *Attorney, Agent, or Firm* — Rabin & Berdo, P.C.

(57) ABSTRACT

A method of manufacturing a semiconductor device includes: forming a lattice defect layer in a substrate having a front surface region where a bipolar element of a pn junction type is formed and a rear surface region opposing the front surface region, the lattice defect layer being formed by injecting a charged particle to a first region in the rear surface region of the substrate; forming a laminated region, in which a first conductivity type impurity region and a second conductivity type impurity region are sequentially laminated from a rear surface side of the substrate toward the first region, in a second region in the rear surface region of the substrate, the first region being positioned deeper than the second region from a rear surface of the substrate; and selectively activating the laminated region by laser annealing after the formation of the laminated region and the lattice defect layer.

7 Claims, 7 Drawing Sheets

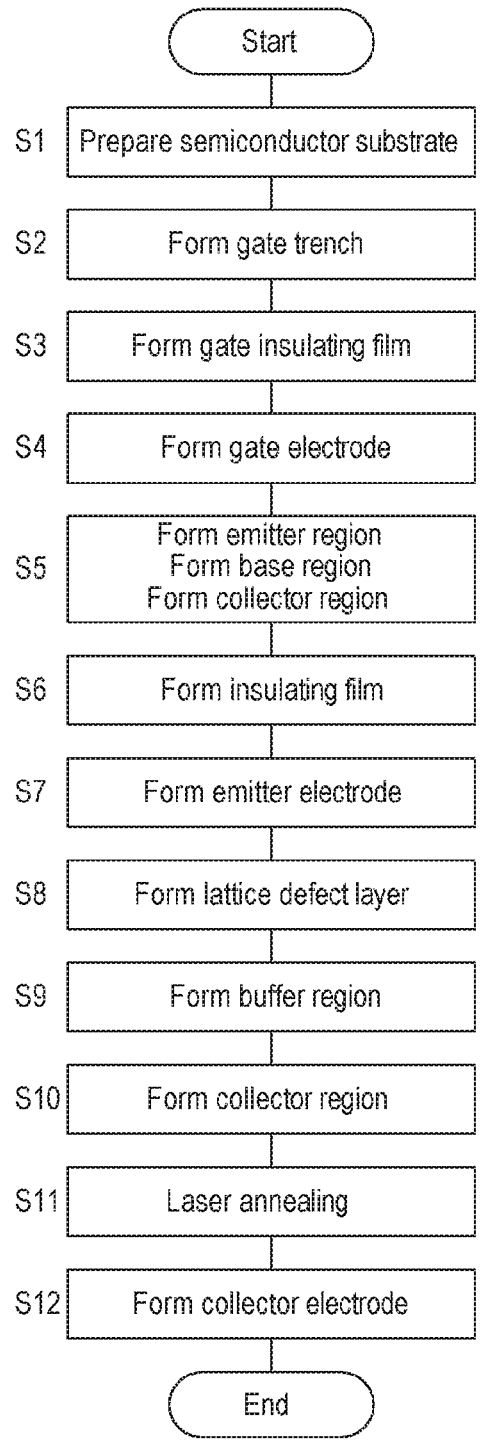

Laser annealing

US 9,786,763 B2

SEMICONDUCTOR DEVICE AND MANUFACTURING METHOD THEREOF

CROSS-REFERENCE TO RELATED APPLICATION(S)

This application is based upon and claims the benefit of priority from Japanese Patent Application No. 2015-221440, filed on Nov. 11, 2015, the entire contents of which are incorporated herein by reference.

TECHNICAL FIELD

The present disclosure relates to a semiconductor device and a manufacturing method thereof.

BACKGROUND

In a bipolar element having a pn junction, such as an insulated gate bipolar transistor (IGBT), in order to realize high-speed switching, it is required to precisely control a lifetime of a minority carrier remaining in a substrate in a switching-off state. As one of the methods of precisely controlling a lifetime of a minority carrier, a configuration of introducing a lattice defect layer in a rear side of a substrate has been known.

For example, in a method of manufacturing a semiconductor device, a lattice defect layer is formed by irradiating a proton ($H^+$), a helium (He) ion, or the like to a rear side of a substrate and an annealing process is then executed thereon.

In the method of executing an annealing process after the lattice defect layer is formed, since heat is also applied to the lattice defect layer, there is a possibility that a lattice defect is recovered (becomes extinct). In the annealing process, a heat processing furnace (baking furnace) is generally used. However, in the annealing process using a heat processing furnace, it is difficult to adjust conditions such as temperature or time, and recovery of a lattice defect in the lattice defect layer becomes more pronounced. The recovery in the lattice defect of the lattice defect layer leads to difficulty in controlling a lifetime of a minority carrier, making it difficult to realize high-speed switching.

SUMMARY

The present disclosure provides some embodiments of a method of manufacturing a semiconductor device capable of desirably controlling a lifetime of a minority carrier and contributing to realization of high-speed switching, and a semiconductor device manufactured by the manufacturing method.

According to one embodiment of the present disclosure, there is provided a method of manufacturing a semiconductor device including a pn junction type bipolar element, including: forming a lattice defect layer in a substrate having a front surface region where the bipolar element is formed and a rear surface region opposing the front surface region, the lattice defect layer being formed by injecting a charged particle to a first region in the rear surface region of the substrate; forming a laminated region, in which a first conductivity type impurity region and a second conductivity type impurity region are sequentially laminated from a rear surface side of the substrate toward the first region, in a second region in the rear surface region of the substrate, the first region being positioned deeper than the second region from a rear surface of the substrate; and selectively activating the laminated region by laser annealing after the formation of the laminated region and the lattice defect layer.

BRIEF DESCRIPTION OF THE DRAWINGS

FIG. 2 is a flowchart illustrating an example of a method of manufacturing the semiconductor device illustrated in FIG. 1.

DETAILED DESCRIPTION

Embodiments of the present disclosure will be now described in detail with reference to the drawings.

Figure 1:
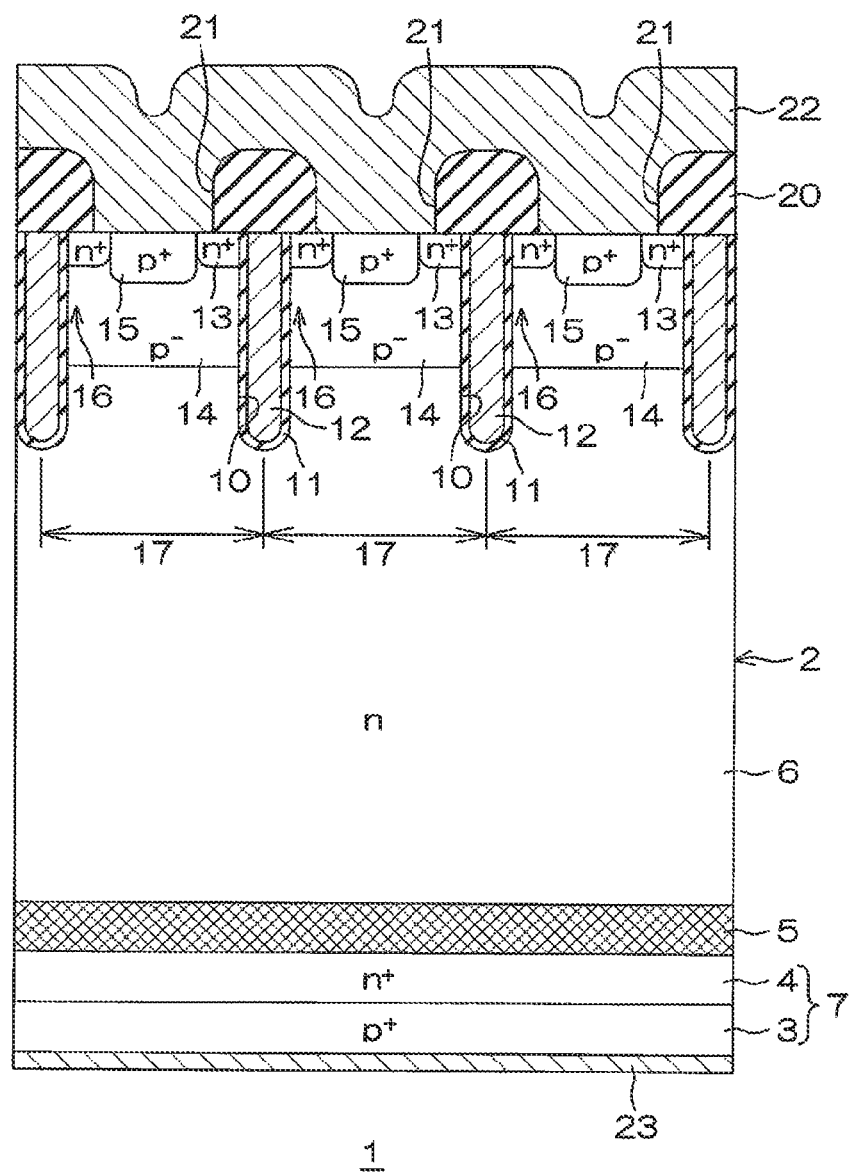
FIG. 1 is a schematic cross-sectional view of a semiconductor device according to an embodiment of the present disclosure.

FIG. 1 is a schematic cross-sectional view of a semiconductor device 1 according to an embodiment of the present disclosure.

The semiconductor device 1 is a device having a trench gate-type insulated gate bipolar transistor (IGBT) as an example of a bipolar element having a pn junction. The semiconductor device 1 includes an n-type semiconductor substrate 2. The semiconductor substrate 2 is, for example, a silicon substrate, and has a front surface and a rear surface opposite the front surface. A unit cell 17 constituting a portion of IGBT to be described later is formed in a surface region of the semiconductor substrate 2.

The semiconductor substrate 2 includes a $p^+$ type collector region 3, an $n^+$ type buffer region 4, a lattice defect layer 5, and an n-type drift region 6 positioned sequentially from the rear side. In FIG. 1, the lattice defect layer 5 is cross-hatched for clarification.

The collector region 3 and the buffer region 4 are formed as a laminated region 7 in a rear region of the semiconductor substrate 2. The collector region 3 is exposed from the rear surface of the semiconductor substrate 2. The buffer region 4 is formed on the collector region 3 so as to be in contact with the collector region 3. The buffer region 4 includes phosphor (P) as an n-type impurity.

The lattice defect layer 5 is interposed between the drift region 6 and the laminated region 7 (buffer region 4). The lattice defect layer 5 is in contact with the drift region 6 and the laminated region 7 (buffer region 4). The lattice defect layer 5 is a highly resistive layer having resistivity (resistance value) higher than that of the collector region 3 and the buffer region 4 as a lattice defect is introduced by a charged particle. An n-type impurity and argon (Ar) are examples of the charged particle.

When the charged particle is an n-type impurity, the lattice defect layer 5 is a region where the corresponding n-type impurity is present without making a donor. In other words, the lattice defect layer 5 is a highly resistive layer, which is deactivated in a state where an n-type impurity is injected so that the lattice defect is not recovered, and as a result, resistivity (resistance value) is increased. In order to form the lattice defect layer 5, in some embodiments, the same n-type impurity (i.e., phosphor) as that of the buffer region 4 is used. In this case, phosphor is present, without making a donor, in the lattice defect layer 5, and is detected by a known secondary ion mass spectrometry (SIMS) method.

On the other hand, when the charged particle is argon, the lattice defect layer 5 has a lattice defect concentration higher than a lattice defect concentration of the buffer region 4, making a highly resistive layer having high resistivity (resistance value). As the charged particle, proton ($H^+$) or helium (He) may be employed instead of argon. In this case, an impurity concentration of the lattice defect layer 5 is not naturally changed by irradiation of argon.

The drift region 6 is formed using a portion of the semiconductor substrate 2. A portion (not shown) of the drift region 6 is exposed from the front surface of the semiconductor substrate 2. A plurality of gate trenches 10 are formed at intervals in the surface region of the semiconductor substrate 2.

A gate electrode 12 is embedded through a gate insulating film 11 within each of the gate trenches 10. On the side of the plurality of gate trenches 10, an $n^+$ type emitter region 13, a $p^-$ type base region 14, and the aforementioned drift region 6 are sequentially formed from the surface side of the semiconductor substrate 2 toward the rear side thereof.

The base region 14 is shared by one gate trench 10 and another gate trench 10 in the unit cell 17. The emitter region 13 is formed on a side surface of each of the gate trenches 10 in the unit cell 17 to be exposed from the front surface of the semiconductor substrate 2. A $p^+$ type contact region 15 is formed in a surface region of the base region 14 and also formed to be sandwiched between the emitter regions 13.

In the base region 14, a region between the emitter region 13 and the drift region 6 is a channel 16, and accordingly, a plurality of unit cells 17 forming a portion of IGBT are formed. The unit cell 17 is defined as a region sandwiched between a central line of one gate trench 10 and a central line of another gate trench 10 in the cross-sectional view of FIG. 1.

In this configuration, the lattice defect layer 5 faces regions between the plurality of gate trenches 10 in addition to lower portions of the gate trenches 10. The lattice defect layer 5 faces the unit cell 17, and is laterally drawn to face from one unit cell 17 to another adjacent unit cell 17. The lattice defect layer 5 faces all the unit cells 17 in this embodiment.

An insulating film 20 is formed on the front surface of the semiconductor substrate 2 to cover the gate trenches 10. A contact hole 21 that exposes a portion of the emitter region 13 and the contact region 15 is formed in the insulating film 20. An emitter electrode 22 is formed on the insulating film 20.

The emitter electrode 22 enters the contact hole 21 from an upper side of the insulating film 20 and is electrically connected to the emitter region 13 and the contact region 15 within the corresponding contact hole 21. A collector electrode 23 is formed on the rear surface of the semiconductor substrate 2. The collector electrode 23 is electrically connected to the collector region 3.

Next, a method of manufacturing the semiconductor device 1 will be described. FIG. 2 is a flowchart illustrating an example of a method of manufacturing the semiconductor device illustrated in FIG. 1.

In order to manufacture the semiconductor device 1, first, a semiconductor substrate 2 is prepared (step S1). Subsequently, for example, the semiconductor substrate 2 selectively digs in from the front surface of the semiconductor substrate 2 toward the rear surface thereof through etching using a mask to form a plurality of gate trenches 10 (step S2).

Thereafter, a gate insulating film 11 for covering an inner surface of the gate trench 10 is formed through, for example, a chemical vapor deposition (CVD) method (step S3). Subsequently, polysilicon is embedded in the gate trenches 10 through, for example, a CVD method (step S4). Accordingly, a gate electrode 12 is formed.

Thereafter, an emitter region 13, a base region 14, and a contact region 15 are formed by selectively injecting an n-type impurity and a p-type impurity through, for example, an ion implantation mask (step S5). Accordingly, a unit cell 17 forming an IGBT is formed in the semiconductor substrate 2.

Thereafter, $SiO_2$ is deposited by, for example, a CVD method, to form an insulating film 20 (step S6). Next, the insulating film 20 is selectively etched to form a contact hole 21 that exposes a portion of the emitter region 13 and the contact region 15 in the insulating film 20.

Thereafter, aluminum is deposited on the insulating film 20 through, for example, a sputtering method (step S7). Accordingly, an emitter electrode 22 is formed. Subsequently, a structure of a rear side of the semiconductor substrate 2 is formed. Hereinafter, a method of manufacturing the structure of the rear side of the semiconductor substrate 2 will be described with reference to FIGS. 3A to 3E.

FIGS. 3A to 3E are cross-sectional views illustrating a process of a method of manufacturing the semiconductor device 1 illustrated in FIG. 1.

Figure 3A:
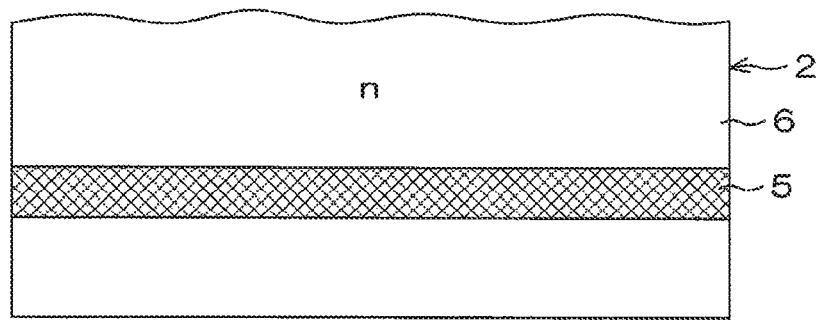
FIG. 3A is a cross-sectional view illustrating a process of a method of manufacturing the semiconductor device illustrated in FIG. 1.

First, as illustrated in FIG. 3A, a charged particle is injected to a relatively deep position from a rear region of the semiconductor substrate 2 to form a lattice defect layer 5 (step S8). The charged particle injected in this process is an n-type impurity or argon (Ar). In this embodiment, an example in which an n-type impurity (phosphor) is injected as the charged particle will be described. An injection amount of the n-type impurity ranges, e.g., from $1.0 \times 10^{10}$ $cm^{-2}$ to $1.0 \times 10^{13}$ $cm^{-2}$ (in this embodiment, about $1.0 \times 10^{12}$ $cm^2$), and an injection energy thereof ranges from 1000 keV to 3000 keV (in this embodiment, about 1200 keV). The lattice defect layer 5 is formed to have a depth ranging, e.g., from about 1 μm to 3 μm, from the rear surface of the semiconductor substrate 2.

Figure 3B:
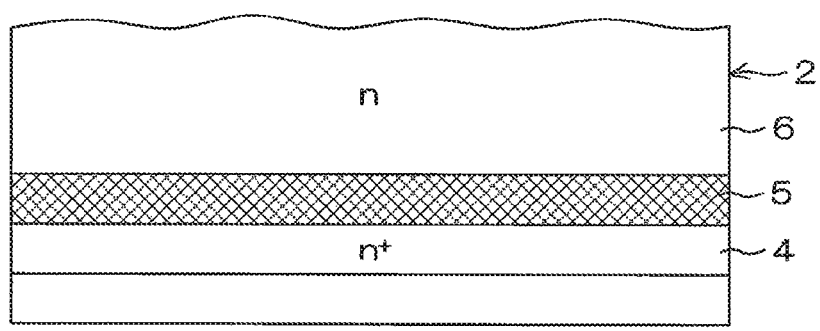
FIG. 3B is a cross-sectional view illustrating a next process of FIG. 3A.

Next, as illustrated in FIG. 3B, an n-type impurity is injected in a region between the lattice defect layer 5 and the rear surface of the semiconductor substrate 2 to form a buffer region 4 (step S9). The n-type impurity injected in this process may be phosphor (P). An injection amount of the n-type impurity is greater than that when the lattice defect layer 5 is formed, for example, ranges from $1.0 \times 10^{12}$ $cm^{-2}$ to $2.0 \times 10^{13}$ $cm^{-2}$ (in this embodiment, about $2.0 \times 10^{12}$ $cm^{-2}$). An injection energy of the n-type impurity is smaller than that when the lattice defect layer 5 is formed, for example, ranges from 400 keV to 800 keV (in this embodiment, about 600 keV). The buffer region 4 is formed to have a depth ranging from about 0.1 µm or 0.2 µm to 1 µm, from the rear surface of the semiconductor substrate 2.

Further, by forming the lattice defect layer 5 with phosphor (P) as the n-type impurity during the process of forming the aforementioned lattice defect layer 5 (step S8), it is possible to form the lattice defect layer 5 and the buffer region 4 using a well know apparatus and process. Thus, the manufacturing method can be simplified.

Figure 3C:
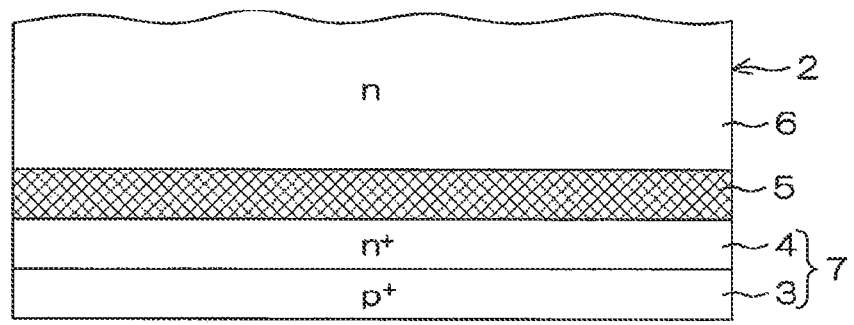
FIG. 3C is a cross-sectional view illustrating a next process of FIG. 3B.

Thereafter, as illustrated in FIG. 3C, a p-type impurity is injected in a region between the buffer region 4 and the rear surface of the semiconductor substrate 2 to form a collector region 3 (step S10). The p-type impurity injected in this process may be boron (B). An injection amount of the p-type impurity is greater than that when the buffer region 4 is formed, for example, ranges from $1.0 \times 10^{13}$ cm$^{-2}$ to $1.0 \times 10^{14}$ cm$^{-2}$ (in this embodiment, about $2.0 \times 10^{13}$ cm$^{-2}$). An injection energy of the p-type impurity is smaller than that when the buffer region 4 is formed, for example, ranges from 10 keV to 100 keV (in this embodiment, about 30 keV). The collector region 3 is formed to have a depth ranging from about 0.1 µm to 0.4 µm, from the rear surface of the semiconductor substrate 2.

Accordingly, a laminated region 7 in which the collector region 3 and the buffer region 4 are sequentially laminated from the rear region toward a region where the lattice defect layer 5 is formed in a relatively shallow region of the rear region of the semiconductor substrate 2.

Figure 3D:
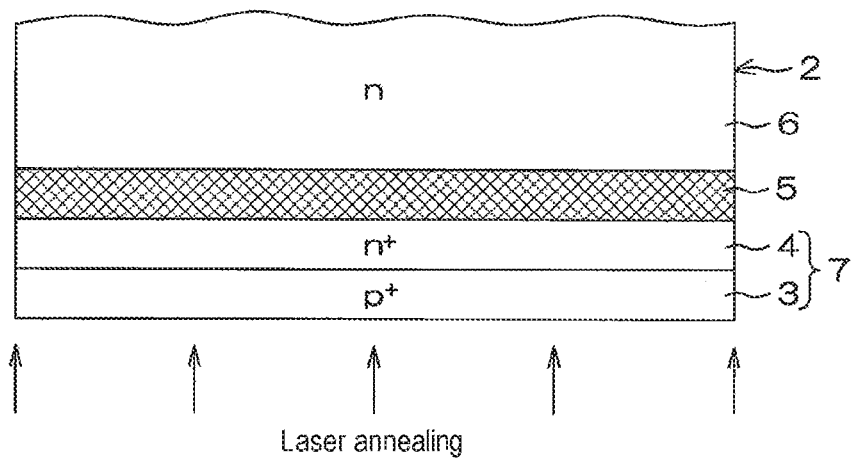
FIG. 3D is a cross-sectional view illustrating a next process of FIG. 3C.

As illustrated in FIGS. 2 and 3D, the present disclosure shows that the laminated region 7 is selectively activated by laser annealing after the formation of the lattice defect layer 5 and the laminated region 7 (step S11). The laser annealing is executed by a radiant energy ranging from 1.2 J/cm$^2$ to 2.1 J/cm$^2$ (in this embodiment, about 1.8 J/cm$^2$), for example, under a nitrogen gas atmosphere using a nitrogen gas as a main ingredient.

According to the laser annealing, it is possible to locally heat the semiconductor substrate 2, without heating the entire semiconductor substrate 2. Further, according to the laser annealing, an arrival depth of the laser can be adjusted by adjusting an irradiation energy. Thus, it is possible to activate the entire laminated region 7, while avoiding activation of the lattice defect layer 5, namely, while leaving the lattice defect layer 5. Accordingly, since the lattice defect layer 5, which is a deactivated region of the n-type impurity, can be desirably formed on the laminated region 7, it is possible to manufacture the semiconductor device 1 capable of desirably controlling a lifetime of a minority carrier and contributing to realization of high-speed switching.

Figure 3E:
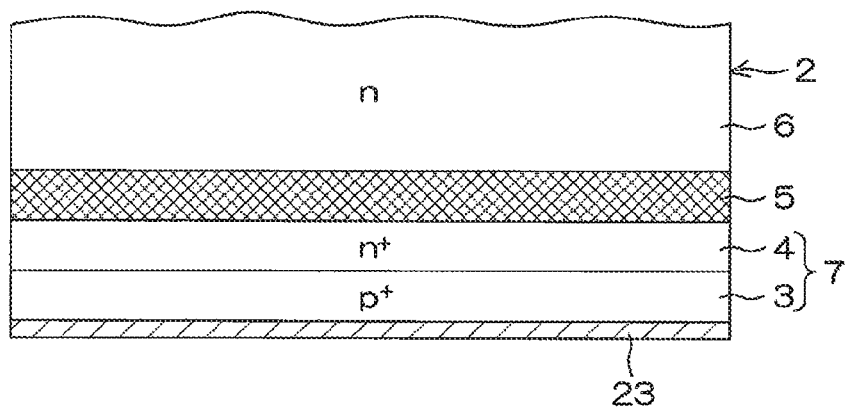
FIG. 3E is a cross-sectional view illustrating a next process of FIG. 3D.

Thereafter, as illustrated in FIG. 3E, aluminum is deposited on the entire rear surface of the semiconductor substrate 2 through, for example, a sputtering method (step S12). Accordingly, a collector electrode 23 is formed. In this manner, the semiconductor device 1 is formed.

Figure 4:
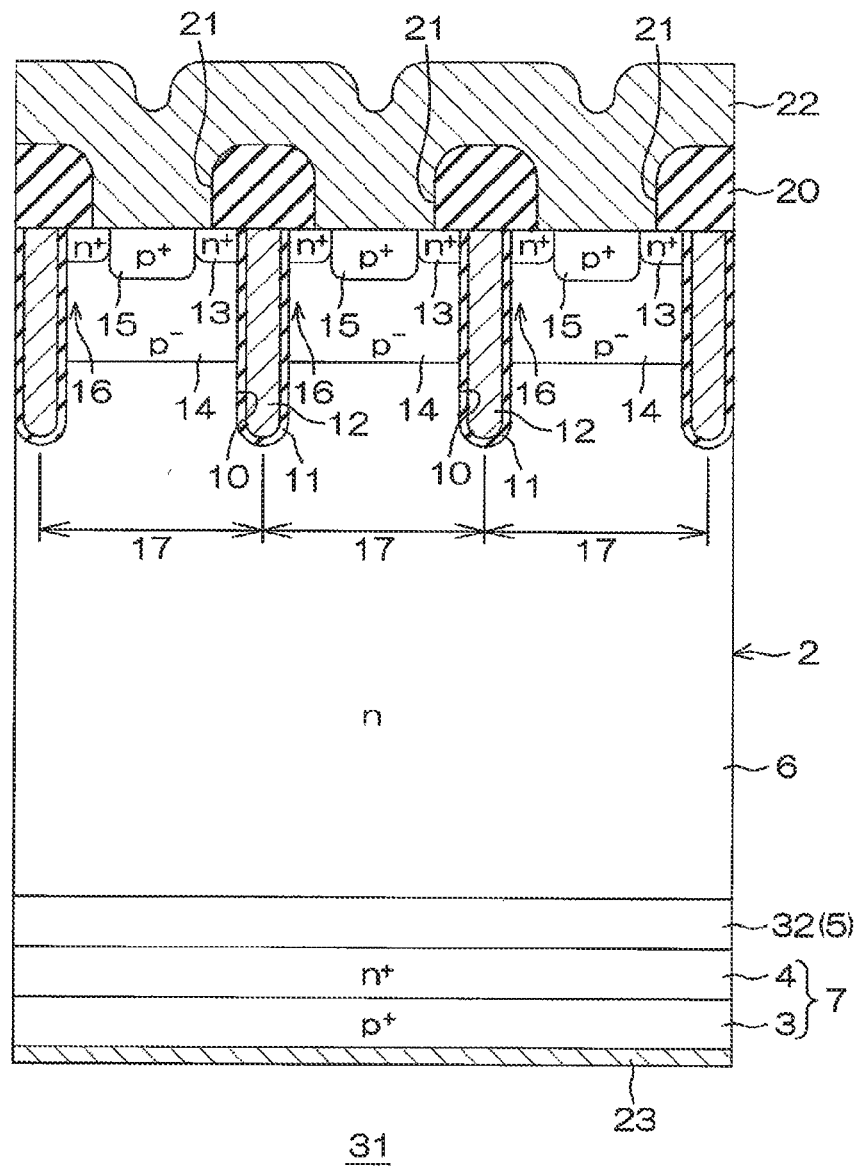
FIG. 4 is a schematic cross-sectional view of a semiconductor device according to a reference example.

As illustrated in FIG. 4, a semiconductor device 31 according to a reference example is prepared for comparison with the configuration of the semiconductor device 1 according to the present embodiment. FIG. 4 is a schematic cross-sectional view of the semiconductor device 31 according to the reference example.

In the semiconductor device 31 according to the reference example illustrated in FIG. 4, an annealing process using a heat processing furnace (baking furnace) is executed instead of the laser annealing (see step S11 and FIG. 3E). The semiconductor device 31 according to the reference example has almost the same configuration as that of the semiconductor device 1 according to the present disclosure, except that a lattice defect in the lattice defect layer 5 is recovered by the annealing process. In the semiconductor device 31 according to the reference example, in order to be differentiated from the lattice defect layer 5 related to the semiconductor device 1 according to the present embodiment, cross-hatching is removed and the lattice defect layer 5 is referred to as a lattice defect layer 32. In FIG. 4, the same components as those illustrated in FIG. 1 are denoted by the same reference numerals and a description thereof will be omitted.

Figure 5:
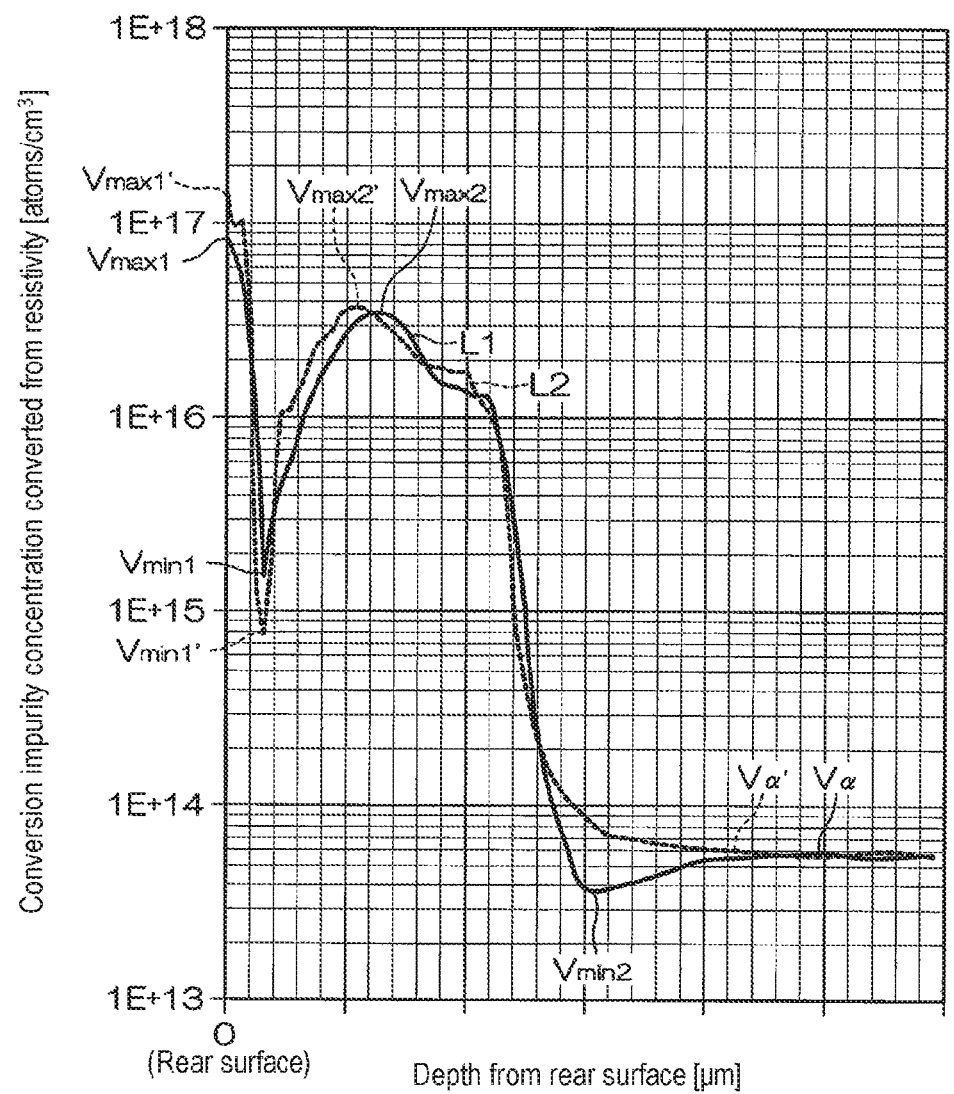
FIG. 5 is a graph illustrating profiles of a conversion impurity concentration converted from resistivity.

A graph obtained by measuring a profile of a conversion impurity concentration converted from resistivity (hereinafter, simply referred to as a "conversion impurity concentration") of the semiconductor device 1 according to the present embodiment and a profile of a conversion impurity concentration of the semiconductor device 31 according to the reference example is illustrated in FIG. 5.

FIG. 5 is a graph illustrating a profile of a conversion impurity concentration of the semiconductor device 1 according to the present embodiment and a profile of a conversion impurity concentration of the semiconductor device 31 according to the reference example. In FIG. 5, the vertical axis represents a conversion impurity concentration, and the horizontal axis represents a depth (distance) from the rear surface of the semiconductor substrate 2 when the corresponding rear surface is designated by zero.

Both the profiles of the conversion impurity concentrations of the semiconductor device 1 according to the present embodiment and the semiconductor device 31 according to the reference example were measured by a known spreading resistance analysis (SR) method. A relationship of $1/\rho = \mu q N$ using carrier mobility µ and an elementary electric charge q is established between the conversion impurity concentration N obtained by the SR method and resistivity ρ. Thus, the conversion impurity concentration and the resistivity are in inverse proportion, and an increase in the conversion impurity concentration in the graph of FIG. 5 indicates a reduction in resistivity and a reduction in the conversion impurity concentration indicates an increase in resistivity.

The solid line graph L1 of FIG. 5 indicates a profile of the conversion impurity concentration of the semiconductor device 1 according to the present disclosure. The broken line graph L2 of FIG. 5 indicates a profile of the conversion impurity concentration of the semiconductor device 31 according to the reference example. Further, the solid line graph L1 and the broken line graph L2 are profiles of conversion impurity concentrations when the lattice defect layers 5 and 32 are formed by injecting an n-type impurity (phosphor) as a charged particle.

Referring to the solid line graph L1, the conversion impurity concentration of the semiconductor device 1 includes a first maximum value $V_{max1}$, a first minimum value $V_{min1}$, a second maximum value $V_{max2}$, and a second minimum value $V_{min2}$ sequentially from the rear surface of the semiconductor substrate 2. The magnitudes of the maximum/minimum values are $V_{min2} < V_{min1} < V_{max2} < V_{max1}$ sequentially from the smallest one.

The first maximum value $V_{max1}$ is positioned to be closest to the rear surface of the semiconductor substrate 2. The conversion impurity concentration of the semiconductor device 1 is gradually decreased from the first maximum value $V_{max1}$ toward the surface side of the semiconductor substrate 2 by a predetermined depth to reach the first minimum value $V_{min1}$. Further, the conversion impurity concentration of the semiconductor device 1 is gradually increased from the first minimum value $V_{min1}$ toward the surface side of the semiconductor substrate 2 by a predetermined depth to reach the second maximum value $V_{max2}$.

Also, the conversion impurity concentration of the semiconductor device 1 is gradually decreased from the second maximum value $V_{max2}$ to ward the surface side of the semiconductor substrate 2 by a predetermined depth to reach the second minimum value $V_{min2}$. Also, the conversion impurity concentration of the semiconductor device 1 is gradually increased from the second minimum value $V_{min2}$ toward the surface side of the semiconductor substrate 2 by a predetermined depth and subsequently reaches a substantially constant value $V_\alpha$ (where $V_{min2}<V_\alpha<V_{min1}$).

It is understood that, as the conversion impurity concentration is reversed from a reduction to an increase at the first minimum value $V_{min1}$, the first maximum value $V_{max1}$ is formed by the p-type collector region 3 and the second maximum value $V_{max2}$ is formed by the n-type buffer region 4. It is also understood that, since the second minimum value $V_{min2}$ is positioned at the surface side of the semiconductor substrate 2 relative to the buffer region 4 and has a conversion impurity concentration lower than those of the collector region 3 and the buffer region 4, the corresponding second minimum value $V_{min2}$ is formed by the lattice defect layer 5. It is understood that the region where the conversion impurity concentration has the substantially constant value $V_\alpha$ from the second minimum value $V_{min2}$ toward the surface side of the semiconductor substrate 2 is formed by the drift region 6.

From the solid line graph L1, it is understood that the lattice defect layer 5 has resistivity (resistance value) higher than those of the collector region 3, the buffer region 4, and the drift region 6. Thus, it is understood that the lattice defect layer 5 is desirably introduced in a region between the buffer region 4 and the drift region 6.

On the other hand, referring to the broken line graph L2, it is understood that the semiconductor device 31 according to the reference example has a similar profile of the conversion impurity concentration to that of the solid line graph L1. However, although the conversion impurity concentration of the semiconductor device 31 has a first maximum value $V_{max1}'$, a first minimum value $V_{min1}'$, and a second maximum value $V_{max2}'$ sequentially from the rear surface side of the semiconductor substrate 2, but the broken line graph L2 does not have a region equivalent to the second minimum value $V_{min2}$ in the solid line graph L1. The conversion impurity concentration of the semiconductor device 31 is gradually decreased from the second maximum value $V_{max2}'$ toward the surface side of the semiconductor substrate 2 by a predetermined depth and subsequently reaches a substantially constant value $V_\alpha'$.

In other words, in the semiconductor device 31 according to the reference example, since the lattice defect in the lattice defect layer 32 becomes extinct (recovered), reduction in the conversion impurity concentration (namely, an increase in resistivity) due to the introduction of the lattice defect layer 32 in the region between the buffer region 4 and the drift region 6 does not occur. Thus, according to the annealing condition applied to the semiconductor device 31 of the reference example, it is understood that a re-combination center based on a lattice defect level is not formed and it is difficult to control a lifetime of a minority carrier, making it difficult to realize high-speed switching.

Figures 6A, 6B:
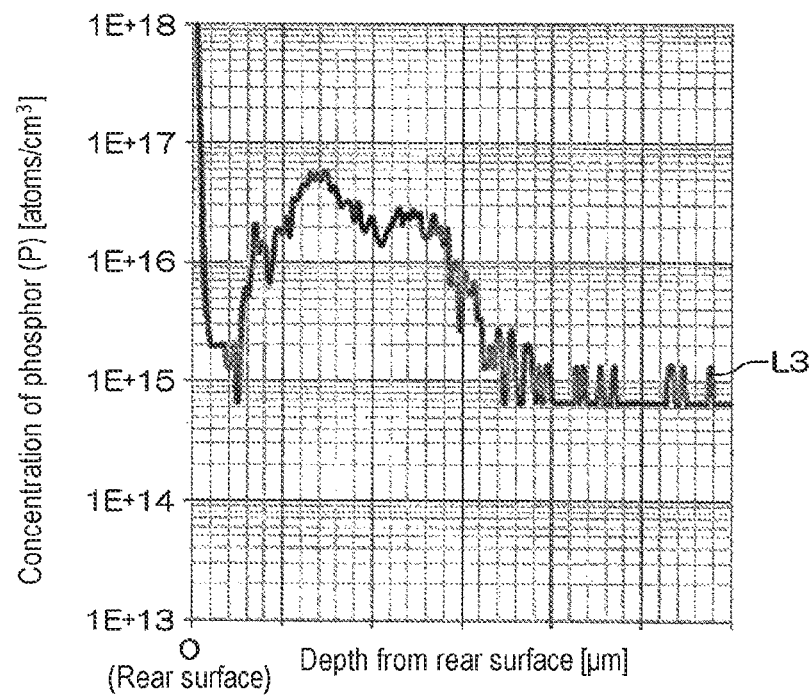
FIG. 6A is a graph illustrating a profile of an impurity concentration of an n-type impurity.
FIG. 6B is a graph obtained by overlapping the profile of the conversion impurity concentration of FIG. 5 on the profile of the impurity concentration of FIG. 6A.

Apart from the SR method, the result of performing SIMS analysis on the structure of the rear surface side of the semiconductor device 1 according to the present embodiment is illustrated in FIG. 6A.

FIG. 6A is a graph illustrating a profile of concentration of phosphor as an n-type impurity. In FIG. 6A, the vertical axis represents a concentration of phosphor and the horizontal axis represents a depth (distance) from the rear surface of the semiconductor substrate 2 when the corresponding rear surface is designated by zero. The solid line graph L3 illustrated in FIG. 6A shows a profile of concentration of phosphor as an n-type impurity of the rear surface side of the semiconductor device 1 according to the present embodiment.

FIG. 6B shows a graph obtained by overlapping the profile of the conversion impurity concentration of FIG. 5 as described above on the profile of concentration of phosphor of FIG. 6A. In FIG. 6B, the solid line graph L1 described above and the solid line graph L3 are illustrated. From FIG. 6B, how phosphor as a dopant is activated can be evaluated. From comparison between the solid line graph L1 and the solid line graph L3, it can be seen that the embedded phosphor is present in the lattice defect layer 5.

Since the lattice defect layer 5 has relatively high resistivity (resistance value), compared with other regions, while having phosphor, it is understood that the phosphor present in the lattice defect layer 5 does not become a donor. Thus, it is understood that the lattice defect layer 5 is desirably introduced in the region between the buffer region 4 and the drift region 6.

Further, the reason why the solid line graph L3 illustrated in FIGS. 6A and 6B does not have a value smaller than $6.0\times10^{14}$ atoms/cm$^3$ is because there is a limitation in detection. FIGS. 6A and 6B are to evaluate an active state of phosphor present in the lattice defect layer 5, and the detection limitation does not cause a burden on the corresponding evaluation. Further, a concentration of phosphor in the drift region 6 or the like is not specified by the detection limitation.

As mentioned above, in this embodiment, since the laser annealing is used as the method of activating the laminated region 7, it is possible to locally heat the semiconductor substrate 2, without heating the entire semiconductor substrate 2. Further, according to the laser annealing, an arrival depth of the laser can be adjusted by adjusting an irradiation energy. Thus, it is possible to activate the entire laminated region 7, while avoiding activation of the lattice defect layer 5, namely, while leaving the lattice defect layer 5.

Accordingly, since the lattice defect layer 5, which is a deactivated region, can be desirably formed on the laminated region 7, it is possible to manufacture the semiconductor device 1 capable of desirably controlling a lifetime of a minority carrier and contributing to realization of high-speed switching. Further, according to the manufacturing method of this embodiment, since it is also possible to simultaneously activate the laminated region 7 and form the lattice defect layer 5, it becomes possible to suppress an increase in the process number and also to simplify the process.

Further, in this embodiment, since the lattice defect layer 5 is formed to face all the unit cells 17, it is possible to suppress switching characteristics of each unit cell 17 from being different. Thus, desirable switching characteristics are provided to all the unit cells 17.

The embodiment of the present disclosure has been described above. However, the present disclosure may also be implemented in any other form.

For example, in the aforementioned embodiment, there has been described an example in which the process of forming the lattice defect layer 5 (step S8), the process of forming the buffer region 4 (step S9), and the process of forming the collector region 3 (step S10) are performed in this order (see FIG. 2 together). However, the processes of forming the lattice defect layer 5, the buffer region 4, and the collector region 3 are not limited to this order. Thus, for example, the collector region 3, the buffer region 4, and the lattice defect layer 5 may be formed in this order, or the lattice defect layer 5, the collector region 3, and the buffer region 4 may be formed in this order.

Further, in the aforementioned embodiment, there has been described an example in which the processes of steps S8 to S12 (see FIGS. 3A to 3E) are performed after the processes of steps S1 to S7. However, the processes of steps S8 to S12 (see FIGS. 3A to 3E) may also be performed before the processes of steps S1 to S7.

In addition, in the aforementioned embodiment, a configuration in which a conductive type of each of the semiconductor portions is reversed may also be employed. In other words, the semiconductor device 1 in which the portion of the p type is an n type and the portion of the n type is a p type may also be employed.

Further, various design changes may be made within the scope of the matters set forth in the appended claims.

According to the method of manufacturing a semiconductor device of the present disclosure, since laser annealing is used as a method of selectively activating a laminated region, it is possible to locally heat a substrate, without heating the entire substrate. Further, according to the laser annealing, an arrival depth of laser relative to the other side of a surface region can be adjusted by adjusting an irradiation energy. Thus, it is possible to activate the laminated region, while avoiding activation of the lattice defect layer, namely, while leaving the lattice defect layer.

Accordingly, since the lattice defect layer, which is a deactivated region, can be desirably formed on the laminated region, it is possible to manufacture a semiconductor device capable of desirably controlling a lifetime of a minority carrier and contributing to realization of high-speed switching. Further, according to the manufacturing method of the present disclosure, since it is also possible to simultaneously activate the laminated region and form the lattice defect layer, it becomes possible to suppress an increase in the process number and also to simplify the process.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device including a bipolar element of a pn junction type, comprising:

forming a lattice defect layer in a substrate having a front surface region where the bipolar element is formed and a rear surface region opposing the front surface region, the lattice defect layer being formed by injecting a charged particle to a first region in the rear surface region of the substrate;

forming a laminated region, in which a first conductivity type impurity region and a second conductivity type impurity region are sequentially laminated from a rear surface side of the substrate toward the first region, in a second region in the rear surface region of the substrate, the first region being positioned deeper than the second region from a rear surface of the substrate; and selectively activating the laminated region by laser annealing after the formation of the laminated region and the lattice defect layer.

2. The method of claim 1, wherein the lattice defect layer has a resistivity higher than that of the second conductivity type impurity region in the laminated region.

3. The method of claim 1, wherein the laminated region is formed in contact with the lattice defect layer.

4. The method of claim 1, wherein the lattice defect layer is formed by injecting a second conductivity type impurity as the charged particle.

5. The method of claim 4, wherein the lattice defect layer is formed by injecting phosphor as the second conductivity type impurity.

6. The method of claim 4, wherein the second conductivity type impurity region in the laminated region is formed by the same second conductivity type impurity as that of the lattice defect layer.

7. The method of claim 1, wherein the lattice defect layer is formed by injecting argon as the charged particle.

* * * * *